US009099512B2

(12) United States Patent
Flaim et al.

(10) Patent No.: US 9,099,512 B2
(45) Date of Patent: Aug. 4, 2015

(54) ARTICLE INCLUDING A DEVICE WAFER REVERSIBLY MOUNTABLE TO A CARRIER SUBSTRATE

(75) Inventors: Tony D. Flaim, St. James, MO (US); Jeremy McCutcheon, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 0 days.

(21) Appl. No.: 12/951,530

(22) Filed: Nov. 22, 2010

(65) Prior Publication Data

US 2011/0069467 A1 Mar. 24, 2011

Related U.S. Application Data

(62) Division of application No. 12/358,951, filed on Jan. 23, 2009.

(60) Provisional application No. 61/023,379, filed on Jan. 24, 2008.

(51) Int. Cl.
*H01L 23/48* (2006.01)
*H01L 23/52* (2006.01)
(Continued)

(52) U.S. Cl.
CPC ........ *H01L 21/6835* (2013.01); *H01L 21/6836* (2013.01); *H01L 2221/6834* (2013.01); *H01L 2221/68318* (2013.01); *H01L 2221/68327* (2013.01); *H01L 2924/0002* (2013.01); *H01L 2924/19041* (2013.01)

(58) Field of Classification Search
CPC ............ H01L 2924/0665; H01L 2221/68318; H01L 2221/68327; H01L 2221/6834; H01L 2224/2919; H01L 2224/8385; H01L 2224/83855; H01L 21/6836

USPC .......... 257/618, 619, 620, 782, 783, 786, 257/E21.23, E21.237; 438/118, 459, 458, 438/455, 465
See application file for complete search history.

(56) References Cited

U.S. PATENT DOCUMENTS

| 3,970,494 A | 7/1976 | Pritchard |
| 4,474,942 A | 10/1984 | Sano et al. |
| 4,558,114 A | 12/1985 | Goel |

(Continued)

FOREIGN PATENT DOCUMENTS

| AT | 503053 | 7/2007 |
| DE | 19628393 | 1/1998 |

(Continued)

OTHER PUBLICATIONS

Office action dated Jan. 18, 2011 in corresponding U.S. Appl. No. 12/358,951, filed Jan. 23, 2009.

(Continued)

*Primary Examiner* — Shouxiang Hu
(74) *Attorney, Agent, or Firm* — Hovey Williams LLP

(57) ABSTRACT

New temporary bonding methods and articles formed from those methods are provided. The methods comprise bonding a device wafer to a carrier wafer or substrate only at their outer perimeters in order to assist in protecting the device wafer and its device sites during subsequent processing and handling. The edge bonds formed by this method are chemically and thermally resistant, but can also be softened, dissolved, or mechanically disrupted to allow the wafers to be easily separated with very low forces and at or near room temperature at the appropriate stage in the fabrication process.

28 Claims, 4 Drawing Sheets

(51) Int. Cl.
H01L 29/06 (2006.01)
H01L 21/683 (2006.01)

(56) References Cited

U.S. PATENT DOCUMENTS

| | | | |
|---|---|---|---|
| 4,710,542 | A | 12/1987 | Forgione et al. |
| 4,855,170 | A | 8/1989 | Darvell et al. |
| 5,043,250 | A | 8/1991 | West et al. |
| 5,195,729 | A | 3/1993 | Thomas et al. |
| 5,654,226 | A | 8/1997 | Temple et al. |
| 5,897,743 | A | 4/1999 | Fujimoto et al. |
| 6,054,363 | A | 4/2000 | Sakaguchi |
| 6,068,727 | A * | 5/2000 | Weaver et al. ............... 156/701 |
| 6,110,999 | A | 8/2000 | Ourth et al. |
| 6,214,702 | B1 | 4/2001 | Kim |
| 6,235,818 | B1 | 5/2001 | Morizono et al. |
| 6,342,434 | B1 | 1/2002 | Miyamoto et al. |
| 6,343,784 | B1 | 2/2002 | Jourde et al. |
| 6,468,879 | B1 | 10/2002 | Lamure et al. |
| 6,589,855 | B2 | 7/2003 | Miyamoto et al. |
| 6,821,376 | B1 | 11/2004 | Rayssac et al. |
| 6,869,894 | B2 | 3/2005 | Moore |
| 6,918,735 | B2 | 7/2005 | Urban et al. |
| 7,084,201 | B2 | 8/2006 | Garfield et al. |
| 7,098,152 | B2 | 8/2006 | Moore |
| 7,118,822 | B2 * | 10/2006 | Mallari et al. ............... 429/532 |
| 7,187,162 | B2 | 3/2007 | Kerdiles et al. |
| 7,713,369 | B2 | 5/2010 | Aspar et al. |
| 8,245,754 | B2 | 8/2012 | Fujita et al. |
| 2002/0042666 | A1 | 4/2002 | Bacchi et al. |
| 2002/0061642 | A1 | 5/2002 | Haji et al. |
| 2002/0115263 | A1 | 8/2002 | Worth et al. |
| 2002/0137859 | A1 * | 9/2002 | Yokota et al. ............... 526/90 |
| 2002/0146903 | A1 | 10/2002 | Locke et al. |
| 2003/0118685 | A1 | 6/2003 | Takita |
| 2003/0149207 | A1 | 8/2003 | Walter et al. |
| 2003/0168158 | A1 | 9/2003 | Kato |
| 2003/0224151 | A1 | 12/2003 | Mitchell et al. |
| 2004/0185187 | A1 | 9/2004 | Yokoyama et al. |
| 2004/0213994 | A1 | 10/2004 | Kozakai et al. |
| 2004/0260021 | A1 | 12/2004 | Macedo et al. |
| 2004/0266947 | A1 | 12/2004 | Macedo et al. |
| 2005/0000636 | A1 | 1/2005 | Geiger et al. |
| 2005/0014347 | A1 | 1/2005 | Tomita et al. |
| 2005/0029224 | A1 | 2/2005 | Aspar et al. |
| 2005/0070072 | A1 | 3/2005 | Priewasser |
| 2005/0150597 | A1 | 7/2005 | Henley et al. |
| 2005/0155704 | A1 | 7/2005 | Yokajty et al. |
| 2005/0164509 | A1 | 7/2005 | Koshimizu et al. |
| 2005/0173064 | A1 | 8/2005 | Miyanari |
| 2005/0181579 | A1 | 8/2005 | Thallner |
| 2005/0191779 | A1 | 9/2005 | Le Vaillant et al. |
| 2005/0221598 | A1 | 10/2005 | Lu et al. |
| 2006/0003165 | A1 | 1/2006 | Akatsuka et al. |
| 2006/0183269 | A1 | 8/2006 | Fuergut et al. |
| 2006/0202220 | A1 | 9/2006 | Hayashi |
| 2006/0286769 | A1 | 12/2006 | Tsuchiya et al. |
| 2007/0062644 | A1 | 3/2007 | Nakamura et al. |
| 2007/0117351 | A1 | 5/2007 | Bradl et al. |
| 2007/0145602 | A1 | 6/2007 | Yang |
| 2007/0155129 | A1 | 7/2007 | Thallner |
| 2007/0185310 | A1 | 8/2007 | Moore et al. |
| 2007/0267972 | A1 | 11/2007 | Menegus et al. |
| 2007/0274871 | A1 | 11/2007 | Jiang |
| 2008/0173970 | A1 | 7/2008 | Pillalamarri et al. |
| 2008/0200011 | A1 | 8/2008 | Pillalamarri et al. |
| 2008/0213079 | A1 | 9/2008 | Herter et al. |
| 2008/0305721 | A1 | 12/2008 | Ohashi et al. |
| 2009/0218560 | A1 | 9/2009 | Flaim et al. |
| 2009/0305617 | A1 | 12/2009 | Nakamura et al. |
| 2009/0314430 | A1 | 12/2009 | Nakamura |
| 2010/0288431 | A1 * | 11/2010 | Bossaert et al. ............... 156/247 |

FOREIGN PATENT DOCUMENTS

| | | |
|---|---|---|
| DE | 101 21 115 | 10/2002 |
| EP | 0 133 357 | 7/1988 |
| EP | 0 849 788 | 6/1998 |
| EP | 1 021 070 | 7/2000 |
| EP | 1 496 547 | 1/2005 |
| EP | 1 681 713 | 7/2006 |
| EP | 1 700 896 | 9/2006 |
| FR | 2783970 | 3/2000 |
| JP | 4074794 | 3/1992 |
| JP | 06-045436 | 2/1994 |
| JP | 07240355 | 9/1995 |
| JP | 08107049 A | 4/1996 |
| JP | 2002-237516 | 8/2002 |
| JP | 2002-531942 | 9/2002 |
| JP | 2004186256 A | 7/2004 |
| JP | 2004253612 A | 9/2004 |
| JP | 2005268690 | 9/2005 |
| JP | 2007-242552 | 9/2007 |
| JP | 2008-171934 | 7/2008 |
| KR | 1020000019536 | 4/2000 |
| RU | 2273075 | 3/2006 |
| SU | 290495 | 11/1971 |
| WO | WO 9106587 | 5/1991 |
| WO | WO 9910925 | 3/1999 |
| WO | 2004006296 | 1/2004 |
| WO | 2005101459 | 10/2005 |
| WO | WO2006093639 | 9/2006 |
| WO | 2008003502 | 1/2008 |
| WO | WO 2008007454 | 1/2008 |
| WO | 2008093408 | 8/2008 |

OTHER PUBLICATIONS

International Preliminary Report on Patentability dated Aug. 5, 2010 in corresponding PCT/US2009/031862.
English abstract only of DE19628393 published Jan. 15, 1998.
Office Action dated Oct. 28, 2010 in corresponding U.S. Appl. No. 12/358,951, filed Jan. 23, 2009.
Search Report dated Mar. 27, 2012 in corresponding Austrian Application No. GM 514/2010.
Office Action dated Aug. 10, 2012 in related European Patent Application No. 10008731.1.
Office Action dated Sep. 13, 2012 in related U.S. Appl. No. 12/819,680, filed Jun. 21, 2010.
Office Action dated May 24, 2012 in related U.S. Appl. No. 12/819,680, filed Jun. 21, 2010.
Office Action dated Feb. 4, 2011 in corresponding Austrian Application No. A 9035/2009.
Office Action dated Feb. 4, 2011 in corresponding Austrian Utility Model Application No. GM 514/2010.
Office Action dated Jul. 6, 2011 in corresponding Chinese Application No. 200980103199.8.
Search Report dated Feb. 8, 2011 in corresponding European Application No. 09703204.9.
Office Action dated Jan. 18, 2011 in corresponding Japanese Application No. 2010-544445.
Office Action dated Aug. 23, 2011 in corresponding Japanese Application No. 2010-544445.
Office Action dated Nov. 1, 2010 in corresponding Korean Application No. 10-2010-7015973.
Office Action dated Feb. 25, 2011 in corresponding Korean Application No. 10-2010-7015973.
Office Action dated Oct. 3, 2011 in corresponding Russian Application No. 2010129076.
International Search Report and Written Opinion dated Aug. 22, 2011 in related PCT/US2010/041726 filed on Jul. 12, 2010.
Office Action dated Jul. 11, 2011 in related Austrian Utility Model Application No. 3A GM 524/2010-1.
Search Report dated Oct. 26, 2010 in related European Application No. 10008731.1.
Search Report dated Jan. 28, 2011 in related European Application No. 10008732.9.

(56) References Cited

OTHER PUBLICATIONS

Office Action dated Mar. 2, 2011 in related German Application No. 10 2010 027 703.7.
Office Action dated Jun. 15, 2011 in related Russian Application No. 2010129938/28.
Office Action dated Nov. 22, 2011, in corresponding Austrian Application No. A 9035/2009.
Office Action dated Jan. 19, 2012, in corresponding European Application No. 09703204.9.
Office Action dated Feb. 16, 2014 in related Israeli Patent Application No. 207044.
Office Action dated Jan. 7, 2014 in corresponding Japanese Patent Application No. 2012-162690.
Office Action dated Jan. 28, 2014 in related German Patent Application No. 102010027703.7.
Office Action dated Apr. 24, 2012 in related Japanese Patent Application No. 2010-183931.
Office Action dated May 3, 2012 in corresponding Chinese Patent Application No. 200980103199.8.
Office Action dated Apr. 16, 2012 in related Korean Patent Application No. 10-2010-0070696.
Office Action dated Mar. 21, 2012 in corresponding Japanese Patent Application No. 2010-544445.
Office Action dated Jun. 20, 2012 in related European Patent Application No. 10008732.9.
Office Action dated Jul. 24, 2012 in corresponding U.S. Appl. No. 12/358,951.
Rivas et al., "Thermal Degradation of Copolymers Based on 2-Substituted Oxazoline and B-Methylhyrdrogenitaconate," 1994, Polymer Bulletin, vol. 33, pp. 97-101.
Boustedt et al., "Flip Chip as an Enabler for MEMS Packaging," 2002, 2002 IEEE Electronics Components and Technology Conference, pp. 124-128.
Watanabe et al., "Three-Component Negative Photosensitive Polyimide Precursor Based on Poly(amic acid), a Crosslinker, and a Photoacid Generator," 2004, Journal of Polymer Science: Part A: Polymer Chemistry, vol. 43, pp. 593-599.
Frump, "Oxazolines, Their Preparation, reactions, and applications," 1971, Chem. Rev., vol. 71 (5), pp. 483-505.
J. Dalvi-Malhotra et al., "Use of silane-based primer on silicon wafers to enhance adhesion of edge-protective coatings during wet etching: Application of the TALON WrapTM process," 2007, Proceedings of SPIE, vol. 6462, pp. 64620B-1-64620B-7.
Hong et al., "High-temperature adhesives for temporary wafer bonding using a sliding approach," IMAPS 2007: Proceedings of the International Microelectronics and Packaging Society 40th International Symposium on Microelectronics, Nov. 11-15, 2007, pp. 1035-1040.
3M Wafer Support System, Products Brochure, 2005, 3M, www.3m.com/electronics, 4 pages.
Kessel et al., "Wafer Thinning with the 3M Wafer Support System," 6 pages, 2004.
Pillalamarri et al., "High-Temperature Spin-on Adhesives for Temporary Wafer Bonding," IMAPS 2006: Proceedings of the International Microelectronics and Packaging Society 39th International Symposium on Microelectronics, Oct. 8-12, 2006, pp. 105-111.
Puligadda et al., "High-Performance Temporary Adhesives for Wafer Bonding Applications," Mater. Res. Soc. Symp. Proc., vol. 970, 2007.
Smith et al., "High temperature-resistant spin-on adhesive for temporary wafer mounting using an automated high-throughput tooling solution," Technical Digest, Austin, TX: CS MANTECH conference, May 14-17, 2007, pp. 29-32.
Search Report and Written Opinion dated Jul. 28, 2009 in corresponding PCT/US2009/031862.
"3M Introduces New System for Ultrathin Wafer Backgrinding," Business Wire, San Francisco, CA, Jul. 12, 2004, 2 pages.
Garrou, "Temporary Bonding for 3-D IC Thinning and Backside Processing," ECTC 2009 San Diego (posted May 24, 2009), 6 pages.
Buna EP T 6250, Lanxess, Lanxess Deutschland GmbH, Business Unit Technical Rubber Products, Product Data Sheet.
Eastman, Eastotac, http:/www.eastman.com/brands/eastotac/producthome.asp?product=71016204.
Eastman, Product Data Sheet, Eastotac Resin H-142W, http://eastman.com/productcatalogapps/pagecontrollers/proddatasheet_PC.aspx?.
F. Niklaus et al., "Adhesive Wafer Bonding," J. Appl. Phys., 2006, 99, 031101.
J. Moore et al., "High Temperature Resistant Adhesive for Wafer Thinning and Backside Processing," MANTECH 2004, 8.10, 4 pages.
C. Brubaker et al., "Advances in Processing of Compound Semiconductor Substrates," MANTECH 2005, 4 pages.
S. Combe et al., "Reversible Wafer Bonding: Challenges in Ramping up 150mm GaAs Wafer Production to Meet Growing Demand," MANTECH 2006, 4 pages.
Y. Kwon et al., "An Evaluation Process of Polymeric Adhesive Wafer Bonding for Vertical System Integration," Japanese Journal of Applied Physics, vol. 44, No. 6A, 2005, pp. 3893-3902.
Technical DataSheet Abstract Ebecryl 168, UCB Chemicals, Additive, Adhesion promoter/Bonding agent, 2006 SpecialChem S.A., 1 page http://www.specialchem4coatings.com/common/pc/product/displayproduct.aspx?id=12887&srchid=220571.
MatWeb, The Online Materials Database: Zeon Chemicals Zeonex 480R Cyclo Olefin Optical Grade Polymer; Subcategory: Cyclo Olefin Polymer, Polymer, Thermoplastic, 2006, 1 page http://www.matweb.com/search/SpecificMaterialPrint.asp?bassnum=PZEON6.
Frank Niklaus, Adhesive Wafer Bonding Technology, Department of Signals, Sensors and Systems, Royal Institute of Technology (KTH), Stockholm, Sweden, Copyright 2002, 33 pages.
Grunsven et al., "Wafer Level Chip Size Packaging Technology for Power Devices Using Low Ohmic Through-Hole Vias," 14th European Microelectronics and Packaging Conference and Exhibition, Germany, Jun. 23-25, 2003, pp. 46-50.
Fukushima et al., "New Three-Dimensional Integration Technology Using Chip-to-Wafer Bonding to Archive Ultimate Super-Chip Integration," The Japan Society of Applied Physics, vol. 43, Mo. 4B, 2006, 3030-3035.
Library 4 Science, Pinene, 2006, 1 page, http://www.chromatography-online org/topics/pinene.html.
Technical DataSheet Abstract Vanax 808 HP, R.T. Vanderbilt, Additive, Crosslinking Catalyst/Accelerator/Initiator>>Amine or Nitrogen Content, 2006 SpecialChem S.A., 2006, 1 page http://www.specialchem4polymers.com/common/pa/product/displayproduct.aspx?id=7815&srchid=292522.
Ciba Specialty Chemicals, Additives, Polymer Additives, Ciba IRGANOX 1010, Phenolic Primary Antioxidant for Processing and Long-Term Thermal Stabilization, Oct. 1999, 2 pages.
Ciba Specialty Chemicals, Additives, Polymer Additives, Ciba IRGAFOS 168, Hydrolytically Stable Phosphite Processing Stabilizer, Sep. 1999, 2 pages.
Chemical Land 21, Organic Chemicals, Mesitylene, 1 page, 2008.
ExxonMobil Chemical Vistalon, Vistalon 2504 Specifications, 2005, 1 page.
Material Safety Data Sheet, ExxonMobil Chemical Company, Vistalon Ethylene Propylene Rubber, Apr. 14, 2005, 1 page.
IDES, The Plastics Web, Zeonex 480R, 1 page, 2006, http://www.ides.com/grades/ds/E40300.htm.
Eastman Product Data Sheet, Eastotack H-142W Resin, Sep. 13, 2006, 2 pages, http://www.eastman.com/ProductCatalogApps/PageControllers/ProdDatasheet_PC.aspx?p . . . .
Eastman H-142 Resin, Application Uses and Key Attributes, Sep. 13, 2006, 1 page http://www.eastman.com/products/producthome.asp-?product=71016204&SelectorUrl=%2 . . . .
www.sigma-aldrich.com, 457531 Poly-a-pinene, Sep. 13, 2006, http://www.sigmaaldrich.com/catalog/search/ProductDetail/ALDRICH/457531?PrtPrv=1 . . . .

\* cited by examiner

ARTICLE INCLUDING A DEVICE WAFER REVERSIBLY MOUNTABLE TO A CARRIER SUBSTRATE

RELATED APPLICATIONS

This application is a divisional application of U.S. patent application Ser. No. 12/358,951, entitled METHOD FOR REVERSIBLY MOUNTING A DEVICE WAFER TO A CARRIER SUBSTRATE, filed Jan. 23, 2009, which claims the priority benefit of U.S. Provisional Application No. 61/023,379, filed Jan. 24, 2008, entitled METHOD FOR REVERSIBLY MOUNTING A DEVICE WAFER TO A CARRIER SUBSTRATE, each of which is incorporated by reference herein in their entirety.

BACKGROUND OF THE INVENTION

1. Field of the Invention

The present invention is broadly concerned with novel temporary wafer bonding methods that can support a device wafer on a carrier substrate during wafer thinning and other backside processing.

2. Description of the Prior Art

Integrated circuits, power semiconductors, light-emitting diodes, photonic circuits, microelectromechanical systems (MEMS), embedded passive arrays, packaging interposers, and a host of other silicon- and compound semiconductor-based microdevices are produced collectively in arrays on wafer substrates ranging from 1-12 inches in diameter. The devices are then separated into individual devices or dies that are packaged to allow practical interfacing with the macroscopic environment, for example, by interconnection with a printed wiring board. It has become increasingly popular to construct the device package on or around the die while it is still part of the wafer array. This practice, which is referred to as wafer-level packaging, reduces overall packaging costs and allows a higher interconnection density to be achieved between the device and its microelectronic environment than with more traditional packages that usually have outside dimensions several times larger than the actual device.

Until recently, interconnection schemes have generally been confined to two dimensions, meaning the electrical connections between the device and the corresponding board or packaging surface to which it is mounted have all been placed in a horizontal, or x-y, plane. The microelectronics industry has now recognized that significant increases in device interconnection density and corresponding reductions in signal delay (as a result of shortening the distance between electrical connection points) can be achieved by stacking and interconnecting devices vertically, that is, in the z-direction. Two common requirements for device stacking are: (1) thinning of the device in the through-wafer direction from the backside; and (2) subsequently forming through-wafer electrical connections, commonly referred to as through-silicon-vias or "TSVs," that terminate on the backside of the device. For that matter, semiconductor device thinning has now become a standard practice even when devices are not packaged in a stacked configuration because it facilitates heat dissipation and allows a much smaller form factor to be achieved with compact electronic products such as cellular telephones.

There is growing interest in thinning semiconductor devices to less than 100 microns to reduce their profiles, especially when they or the corresponding packages in which they reside are stacked, and to simplify the formation of backside electrical connections on the devices. Silicon wafers used in high-volume integrated circuit production are typically 200 or 300 mm in diameter and have a through-wafer thickness of about 750 microns. Without thinning, it would be nearly impossible to form backside electrical contacts that connect with front-side circuitry by passing the connections through the wafer. Highly efficient thinning processes for semiconductor-grade silicon and compound semiconductors based on mechanical grinding (back-grinding) and polishing as well as chemical etching are now in commercial use. These processes allow device wafer thickness to be reduced to less than 100 microns in a few minutes while maintaining precise control over cross-wafer thickness uniformity.

Device wafers that have been thinned to less than 100 microns, and especially those thinned to less than 60 microns, are extremely fragile and must be supported over their full dimensions to prevent cracking and breakage. Various wafer wands and chucks have been developed for transferring ultra-thin device wafers, but the problem still exists of how to support the wafers during back-grinding and TSV-formation processes that include steps such as chemical-mechanical polishing (CMP), lithography, etching, deposition, annealing, and cleaning, because these steps impose high thermal and mechanical stresses on the device wafer as it is being thinned or after thinning. An increasingly popular approach to ultra-thin wafer handling involves mounting the full-thickness device wafer face down to a rigid carrier with a polymeric adhesive. It is then thinned and processed from the backside. The fully processed, ultra-thin wafer is then removed, or debonded, from the carrier by thermal, thermo-mechanical, or chemical processes after the backside processing has been completed.

Common carrier materials include silicon (e.g., a blank device wafer), soda lime glass, borosilicate glass, sapphire, and various metals and ceramics. The carriers may be square or rectangular but are more commonly round and are sized to match the device wafer so that the bonded assembly can be handled in conventional processing tools and cassettes. Sometimes the carriers are perforated to speed the debonding process when a liquid chemical agent is used to dissolve or decompose the polymeric adhesive as the means for release.

The polymeric adhesives used for temporary wafer bonding are typically applied by spin coating or spray coating from solution or laminating as dry-film tapes. Spin- and spray-applied adhesives are increasingly preferred because they form coatings with higher thickness uniformity than tapes can provide. Higher thickness uniformity translates into greater control over cross-wafer thickness uniformity after thinning. The polymeric adhesives exhibit high bonding strength to the device wafer and the carrier.

The polymeric adhesive may be spin-applied onto the device wafer, the carrier, or both, depending on the thickness and coating planarity (flatness) that is required. The coated wafer is baked to remove all of the coating solvent from the polymeric adhesive layer. The coated wafer and carrier are then placed in contact in a heated mechanical press for bonding. Sufficient temperature and pressure are applied to cause the adhesive to flow and fill into the device wafer structural features and achieve intimate contact with all areas of the device wafer and carrier surfaces.

Debonding of a device wafer from the carrier following backside processing is typically performed in one of four ways:

(1) Chemical—The bonded wafer stack is immersed in, or sprayed with, a solvent or chemical agent to dissolve or decompose the polymeric adhesive.

(2) Photo-Decomposition—The bonded wafer stack is irradiated with a light source through a transparent carrier to photo-decompose the adhesive boundary layer that is adjacent to the carrier. The carrier can then be separated from the stack, and the balance of the polymeric adhesive is peeled from the device wafer while it is held on a chuck.

(3) Thermo-Mechanical—The bonded wafer stack is heated above the softening temperature of the polymeric adhesive, and the device wafer is then slid or pulled away from the carrier while being supported with a full-wafer holding chuck.

(4) Thermal Decomposition—The bonded wafer stack is heated above the decomposition temperature of the polymeric adhesive, causing it to volatilize and lose adhesion to the device wafer and carrier.

Each of these debonding methods has drawbacks that seriously limit its use in a production environment. For example, chemical debonding by dissolving the polymeric adhesive is a slow process because the solvent must diffuse over large distances through the viscous polymer medium to effect release. That is, the solvent must diffuse from the edge of the bonded substrates, or from a perforation in the carrier, into the local region of the adhesive. In either case, the minimum distance required for solvent diffusion and penetration is at least 3-5 mm and can be much more, even with perforations to increase solvent contact with the adhesive layer. Treatment times of several hours, even at elevated temperatures (>60° C.), are usually required for debonding to occur, meaning wafer throughput will be low.

Photo-decomposition is likewise a slow process because the entire bonded substrate cannot be exposed at one time. Instead, the exposing light source, which is usually a laser having beam cross-section of only a few millimeters, must be focused on a small area at a time to deliver sufficient energy for decomposition of the adhesive bond line to occur. The beam is then scanned (or rastered) across the substrate in a serial fashion to debond the entire surface, which leads to long debonding times.

While thermo-mechanical (TM) debonding can be performed typically in a few minutes, it has other limitations that can reduce device yield. Backside processes for temporarily bonded device wafers often involve working temperatures higher than 200° C. or even 300° C. The polymeric adhesives used for TM debonding must neither decompose nor soften excessively at or near the working temperature, otherwise, debonding would occur prematurely. As a result, the adhesives are normally designed to soften sufficiently at 20-50° C. above the working temperature for debonding to occur. The high temperature required for debonding imposes significant stresses on the bonded pair as a result of thermal expansion. At the same time, the high mechanical force required to move the device wafer away from the carrier by a sliding, lifting, or twisting motion creates additional stress that can cause the device wafer to break or produces damage within the microscopic circuitry of individual devices, which leads to device failure and yield loss.

Thermal decomposition (TD) debonding is also prone to wafer breakage. Gases are produced when the polymeric adhesive is decomposed, and these gases can become trapped between the device wafer and the carrier before the bulk of the adhesive has been removed. The accumulation of trapped gases can cause the thin device wafer to blister and crack or even rupture. Another problem with TD debonding is that polymer decomposition is often accompanied by the formation of intractable, carbonized residues that cannot be removed from the device wafer by common cleaning procedures.

The limitations of these prior art debonding methods for polymeric adhesives have created the need for new modes of carrier-assisted thin wafer handling that provide high wafer throughput and reduce or eliminate the chances for device wafer breakage and internal device damage.

SUMMARY OF THE INVENTION

The present invention broadly provides a novel temporary bonding method. In one embodiment, the method comprises providing a stack comprising a first substrate having a back surface and a device surface, where the device surface has a peripheral region and a central region. The stack further comprises a second substrate having a carrier surface and an edge bond bonded to the peripheral region and to the carrier surface. The edge bond is absent from at least some of the central region, thus forming a fill zone, with a fill material being present in the fill zone. The method further comprises separating the first and second substrates.

In a further embodiment, the method comprises providing a first substrate having front and back surfaces, where the front surface has a peripheral region and a central region. An edge bond is formed on the peripheral region, and the edge bond is absent from at least some of the central region. A fill material is deposited into the central region.

In yet another embodiment, the invention provides an article comprising a first substrate having front and back surfaces. The front surface of the first substrate has a peripheral region and a central region. The article further comprises an edge bond bonded to the peripheral region, with the edge bond being absent from at least some of the central region so as to form a fill zone, which includes a fill material therein.

In a further embodiment, the invention is directed towards an article comprising a substrate having front and back surfaces. The front surface of the substrate has a peripheral region and a central region, and a layer of material is on the front surface at the central region. The layer is absent from the peripheral region and is selected from the group consisting of a low adhesive strength layer and a surface modification of the front surface.

DETAILED DESCRIPTION OF THE PREFERRED EMBODIMENTS

Figure 1:
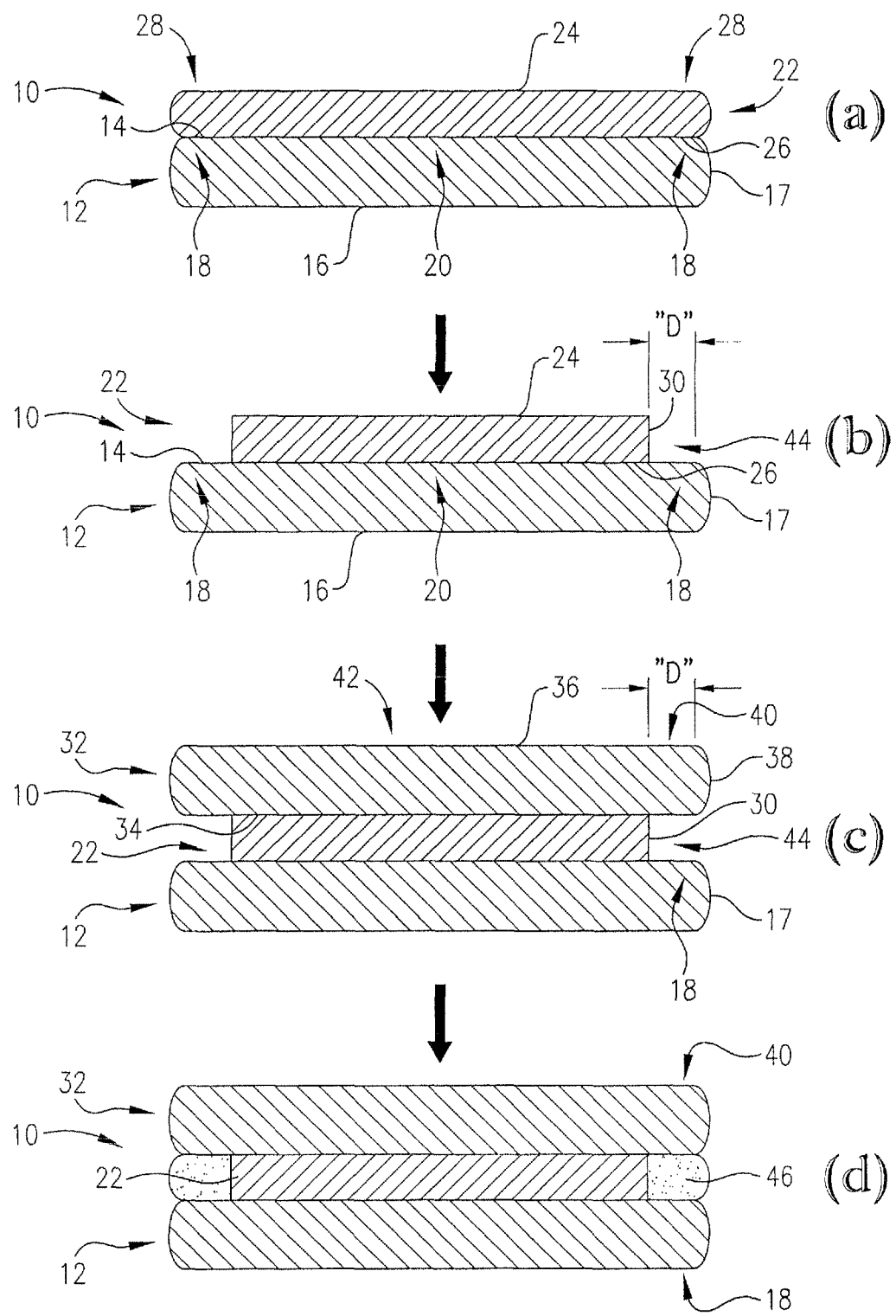
FIG. 1 is a schematic drawing showing one embodiment for bonding substrates according to the invention.

FIG. 1 depicts one process by which the peripheral bonding of the present invention can be carried out. Referring to step (a) of FIG. 1, a precursor structure 10 is depicted in a schematic and cross-sectional view. Structure 10 includes a first substrate 12. In this embodiment, first substrate 12 is a device wafer. That is, substrate 12 has a front or device surface 14, a back surface 16, and an outermost edge 17. Although substrate 12 can be of any shape, it would typically be circular in shape. Regardless of the shape, the front or device surface 14 has a peripheral region 18 and a central region 20.

Preferred first substrates 12 include device wafers whose device surfaces comprise arrays of devices selected from the group consisting of integrated circuits, MEMS, microsensors, power semiconductors, light-emitting diodes, photonic circuits, interposers, embedded passive devices, and other microdevices fabricated on or from silicon and other semiconducting materials such as silicon-germanium, gallium arsenide, and gallium nitride. The surfaces of these devices commonly comprise structures formed from one or more of the following materials: silicon, polysilicon, silicon dioxide, silicon (oxy)nitride, metals (e.g., copper, aluminum, gold, tungsten, tantalum), low k dielectrics, polymer dielectrics, and various metal nitrides and silicides. The device surface 14 can also include raised structures such as solder bumps and metal posts and pillars.

A fill material is applied to the device surface 14 of substrate 12 so as to form a fill layer 22. Fill layer 22 has first and second surfaces 24, 26 as well as outermost portion 28. It is preferred that the fill layer 22 be applied so that it has a thickness (measured at its thickest point) of from about 5 µm to about 100 µm, more preferably from about 5 µm to about 50 µm, and even more preferably from about 10 µm to about 30 µm.

Application of the fill material can be carried out via any conventional means, including spin coating, casting from solution (e.g., meniscus coating or roller coating), ink jetting, and spray coating. When applied via spin coating, the material forming fill layer 22 will typically be spin coated at speeds of from about 500 rpm to about 5,000 rpm for a time period of from about 60 seconds to about 120 seconds. The layer would then be baked near or above the boiling point of the solvent(s) present in the fill layer 22 (e.g., from about 80° C. to about 250° C.) for a time period of from about 1 minute to about 15 minutes to reduce the residual solvent content in fill layer 22 to less than about 1% by weight.

Fill layer 22 is typically formed of a material comprising monomers, oligomers, and/or polymers dispersed or dissolved in a solvent system. If the fill layer will be applied via spin coating, it is preferred that the solids content of this material be from about 1% by weight to about 50% by weight, more preferably from about 5% by weight to about 40% by weight, and even more preferably from about 10% by weight to about 30% by weight. Examples of suitable monomers, oligomers, and/or polymers include those selected from the group consisting of cyclic olefin polymers and copolymers and amorphous fluoropolymers with high atomic fluorine content (greater than about 30% by weight) such as fluorinated siloxane polymers, fluorinated ethylene-propylene copolymers, polymers with pendant perfluoroalkoxy groups, and copolymers of tetrafluoroethylene and 2,2-bis-trifluoromethyl-4,5-difluoro-1,3-dioxole being particular preferred. It will be appreciated that the bonding strength of these materials will depend upon their specific chemical structures and the coating and baking conditions used to apply them.

Examples of suitable solvent systems for cyclic olefin polymers and copolymers include solvents selected from the group consisting of aliphatic solvents such as hexane, decane, dodecane, and dodecene; alkyl-substituted aromatic solvents such as mesitylene; and mixtures thereof. Suitable solvent systems for amorphous fluoropolymers include fluorocarbon solvents sold, for example, by 3M Corporation under the FLUORINERT® label.

In another embodiment, the fill layer 22 could also be formed of a polymeric material that contains dispersed nanoparticles. Suitable nanoparticle materials include those selected from the group consisting of alumina, ceria, titania, silica, zirconia, graphite, and mixtures thereof.

The material of which fill layer 22 is formed should remain stable at temperatures of from about 150° C. to about 350° C., and preferably from about 200° C. to about 300° C. Furthermore, this material should be stable under the chemical exposure conditions encountered in the particular backside processes to which they will be subjected. Fill layer 22 should not decompose (i.e., less than about 1% weight loss) or otherwise lose its mechanical integrity, for example, by melting, under these conditions. The fill layer 22 also should not exhibit outgassing that might cause the thin device wafers to blister or deform, especially when subjected to high-vacuum processes such as during the deposition of CVD dielectric layers.

In this embodiment, the fill layer 22 preferably does not form strong adhesive bonds, thus facilitating separation later. Generally speaking, amorphous polymeric materials that: (1) have low surface free energies; (2) are tack-free and known to not bond strongly to glass, silicon, and metal surfaces (i.e., would typically have very low concentrations of hydroxyl or carboxylic acid groups, and preferably no such groups); (3) can be cast from solution or formed into a thin film for lamination; (4) will flow under typical bonding conditions to fill device wafer surface topography, forming a void-free bond line between substrates; and (5) will not crack, flow, or redistribute under mechanical stresses encountered during backside processing, even when carried out at high temperatures or under high vacuum conditions, are desirable. As used herein, low surface free energy is defined as a polymeric material that exhibits a contact angle with water of at least about 90° and a critical surface tension of less than about 40 dynes/cm, preferably less than about 30 dynes/cm, and more preferably from about 12 dynes/cm to about 25 dynes/cm, as determined by contact angle measurements.

Low bonding strength refers to polymeric materials that do not stick or can be peeled from a substrate with only light hand pressure such as might be used to debond an adhesive note paper. Thus, anything with an adhesion strength of less than about 50 psig, preferably from less than about 35 psig, and more preferably from about 1 psig to about 30 psig would be desirable for use as fill layer 22. As used herein, adhesion strength is determined by ASTM D4541/D7234. Examples of suitable polymeric materials exhibiting the above properties include some cyclic olefin polymers and copolymers sold under the APEL® by Mitsui, TOPAS® by Ticona, and ZEONOR® by Zeon brands, and solvent-soluble fluoropolymers such as CYTOP® polymers sold by Asahi Glass and TEFLON® AF polymers sold by DuPont. The bonding strength of these materials will depend upon the coating and baking conditions used to apply them.

Next, and referring to step (b) of FIG. 1, the outermost portion 28 of fill layer 22 is removed. This can be accomplished by any means that will allow for removal of the desired quantity without damaging the first substrate 12, including dissolving the outermost portion 28 with a solvent that is known to be a good solvent for the material of which fill layer 22 is formed. Examples of such solvents include those selected from the group consisting of aliphatic solvents (e.g., hexane, decane, dodecane, and dodecane), fluorocarbon solvents, and mixtures thereof. After edge removal, fill layer 22 has an outermost edge 30, which is spaced a distance "D" from outer edge 17. "D" is typically from about 2 mm to about 15 mm, preferably from about 2 mm to about 10 mm, and more preferably from about 2 mm to about 5 mm. Contact with the edge removal solvent can be maintained for a sufficient time to dissolve the desired amount of fill layer 22 to achieve the desired distance "D," but typical contact times would be from about 5 seconds to about 60 seconds.

Referring to step (c) of FIG. 1, a second substrate 32 is depicted. In this particular embodiment, second substrate 32 is a carrier substrate. Second substrate 32 includes a carrier surface 34, a back surface 36, and an outer edge 38. As was the case with first substrate 12, second substrate 32 can be of any shape, although it would typically be circular in shape. Furthermore, second substrate 32 would preferably be sized to be approximately equal in size to first substrate 12, so that outer edge 38 of second substrate 32 will lie along substantially the same plane as outer edge 17 of first substrate 12. Regardless of the shape, carrier surface 34 has a peripheral region 40 and a central region 42.

Preferred substrates 32 comprise a material selected from the group consisting of silicon, sapphire, quartz, metals (e.g., aluminum, copper, steel), and various glasses and ceramics. Substrate 32 can also include other materials deposited on its surface 34. For example, silicon nitride can be deposited onto a silicon wafer to change the bonding characteristics of the fill layer 22.

Second substrate 32 is contacted with fill layer 22, leaving a void 44 between the peripheral region 18 of first substrate 12 and the peripheral region 40 of second substrate 32. This contact is preferably carried out under heat and pressure, so as to cause the material of which fill layer 22 is formed to distribute substantially uniformly along the front surface 14 of first substrate 12 as well as along the carrier surface 34 of second substrate 32. The pressure and heat are adjusted based upon the chemical make-up of fill layer 22, and will be selected such that the distance "D" remains substantially the same after pressing the second substrate 32 to the first substrate 12 as before such pressing together. That is, the fill layer 22 will experience little to no flow into the void 44, and the distance "D" after pressing together will be within about 10% of the distance "D" prior to pressing together. Typical temperatures during this step will range from about 150° C. to about 375° C., and preferably from about 160° C. to about 350° C., with typical pressures ranging from about 1,000 N to about 5,000 N, and preferably from about 2,000 N to about 4,000 N.

Next, a bonding material is introduced into void 44 (see step (d) of FIG. 1) to form an edge bond 46, which will have a thickness corresponding to that described above with respect to fill layer 22. Because the void 44 was limited to the outer perimeter of the substrates 12 and 32, the edge bond 46 will likewise be limited. In instances where the substrates 12 or 32 are circular in shape, the edge bond 46 will be ring-shaped. Thus, there is a non-uniform material distribution across the substrates 12 and 32, unlike prior art adhesives which have a uniform layer of the same material between and across the two substrates 12, 32.

The edge bonding material can be introduced by any number of means, with one suitable mechanism being the use of a needle, syringe, or tip dispense instrument to dispense the material into the void 44 while the structure 10 is slowly rotated until the void 44 is filled with the bonding material, thus forming the edge bond 46. The edge bond 46 may also be applied via capillary filling of void 44 or via chemical vapor deposition. In a further application process, a liquid (100% solids or solution), edge bonding material can be spin-applied onto the edge of the carrier or device wafer using an edge-wrapping baffle system before contacting the substrates 12 and 32. One such system is disclosed by Dalvi-Malhotra et al., "Use of silane-based primer on silicon wafers to enhance adhesion of edge-protective coatings during wet etching: Application of the TALON Wrap™ process," Proceedings of SPIE, vol. 6462, 2007, pp. 64620B-1-64620B-7, incorporated by reference herein. The edge bond 46 is then subjected to the appropriate curing or hardening process (e.g., UV curing).

The materials from which edge bond 46 are formed should be capable of forming a strong adhesive bond with the substrates 12 and 32. Anything with an adhesion strength of greater than about 50 psig, preferably from about 80 psig to about 250 psig, and more preferably from about 100 psig to about 150 psig, would be desirable for use as edge bond 46. In addition, the adhesion strength of the edge bond 46 is at least about 0.5 psig, preferably at least about 20 psig, and more preferably from about 50 psig to about 250 psig greater than the adhesion of the fill layer 22. Furthermore, the material of which edge bond 46 is formed must meet the thermal and chemical stability requirements of backside processing. The edge bond 46 should remain stable at temperatures of from about 150° C. to about 350° C., and preferably from about 200° C. to about 300° C. Furthermore, this material should be stable under the chemical exposure conditions encountered in the backside processes to which the bonded stack will be subjected. Edge bond 46 should not decompose (i.e., less than about 1% weight loss) or otherwise lose its mechanical integrity at the above described backside processing temperatures. These materials also should not release volatile compounds that might cause blistering of thin device wafers, especially when subjected to high vacuum processes such as CVD dielectric deposition.

Preferred edge-sealing or edge-bonding materials include commercial temporary wafer bonding compositions such as the WaferBOND® materials (sold by Brewer Science Inc., Rolla, Mo.) along with resins and polymers that exhibit high adhesion strength to semiconductor materials, glass, and metals. Especially preferred are: (1) high solids, UV-curable resin systems such as reactive epoxies and acrylics; (2) related thermosetting resin systems such as two-part epoxy and silicone adhesives; (3) thermoplastic acrylic, styrenic, vinyl halide (non-fluoro-containing), and vinyl ester polymers and copolymers along with polyamides, polyimides, polysulfones, polyethersulfones, and polyurethanes applied from the melt or as solution coatings that are baked after application to dry and render the peripheral regions 18 and 40 more dense; and (4) cyclic olefins, polyolefin rubbers (e.g., polyisobutylene), and hydrocarbon-based tackifier resins. As was the case with the materials used to form fill layer 22, it will be appreciated that the bonding strength of edge bond materials will also depend upon their specific chemical structures and the coating and baking conditions used to apply them.

At this stage, the first substrate 12 can be safely handled and subjected to further processes that might otherwise have damaged first substrate 12 without being bonded to second substrate 32. Thus, the structure can safely be subjected to backside processing such as back-grinding, CMP, etching, metal and dielectric deposition, patterning (e.g., photolithography, via etching), passivation, annealing, and combinations thereof, without separation of substrates 12 and 32 occurring, and without infiltration of any chemistries encountered during these subsequent processing steps into central regions 20 and 42 between substrates 12 and 32.

Advantageously, the dried or cured layers of the stacked structure in this and all embodiments will possess a number of highly desirable properties. For example, the layers will exhibit low outgassing during heating and/or vacuum deposition processes. That is, baking at about 150-300° C. for up to about 60 minutes results in a film thickness change of fill layer 22 and edge bond 46 of less than about 5%, preferably less than about 2%, and even more preferably less than about 1.0%. Thus, the dried layers can also be heated to temperatures of up to about 350° C., preferably up to about 320° C., and more preferably up to about 300° C., without chemical reactions occurring in the layer. In some embodiments, the layers in the bonded stack can also be exposed to polar solvents (e.g., N-methyl-2-pyrrolidone) at a temperature of about 80° C. for about 15 minutes without reacting or dissolving.

The bond integrity of edge bond 46 can be maintained even upon exposure to an acid or base. That is, a dried edge bond 46 having a thickness of about 15 μm can be submerged in an acidic media (e.g., concentrated sulfuric acid) at room temperature for about 10 minutes or in a basic media (e.g., 30 wt. % KOH) at about 85° C. for about 45 minutes while maintaining bond integrity. Bond integrity can be evaluated by using a glass carrier substrate and visually observing the edge bond 46 through the glass carrier substrate to check for bubbles, voids, etc.

Once the desired processing is completed, first substrate 12 and second substrate 32 can be readily separated. In one separation method, the edge bond 46 is first dissolved with the aid of a solvent or other chemical agent. This can be accomplished by immersion in the solvent, or by spraying a jet of the solvent onto edge bond 46 in order to dissolve it. The use of thermoplastic materials is especially desirable if solvent dissolution is to be used to disrupt the edge bond 46. Solvents that could typically be used during this removal process include those selected from the group consisting of ethyl lactate, cyclohexanone, N-methylpyrrolidone, aliphatic solvents (e.g., hexane, decane, dodecane, and dodecene), and mixtures thereof.

The substrates 12 and 32 can also be separated by first mechanically disrupting or destroying the continuity of the edge bond 46 using laser ablation, plasma etching, water jetting, or other high energy techniques that effectively etch or decompose the edge bond 46. It is also suitable to first saw or cut through the edge bond 46 or cleave the edge bond 46 by some equivalent means.

Regardless of which of the above means is utilized, a low mechanical force (e.g., finger pressure, gentle wedging) can then be applied to completely separate the substrates 12 and 32. Advantageously, and unlike prior art bonding methods, separation does not require having to overcome strong adhesive bonds between the fill layer 22 and the substrates 12 or 32. Instead, it is only necessary to release the adhesive bonds at edge bond 46 in the peripheral regions 18 and 40 for separation to occur. The surfaces of the substrates 12 and/or 32 can then be rinsed clean with appropriate solvents as necessary to remove any residual material.

While the above describes the primary method of practicing the present invention, there are several alternative embodiments of the invention. For example, the above embodiment described first substrate 12 as a device wafer and second substrate 32 as a carrier substrate. It is also acceptable that first substrate 12 is the carrier substrate and second substrate 32 is the device wafer. In that instance, front surface 14 of first substrate 12 will not be a device surface, but rather will be a carrier surface. Also, surface 34 of second substrate 32 will not be a carrier surface, but instead will be a device surface. In other words, the fill layer can be applied to the carrier rather than the device wafer with the same quality of stacked structure being formed during the subsequent bonding step.

Furthermore, the above embodiment described the sequential application of the fill layer 22 and edge bond 46 to the same substrate 12. It is also suitable to apply one of fill layer 22 and edge bond 46 to first substrate 12, and the other of fill layer 22 and edge bond 46 to second substrate 32. The first and second substrates could then be pressed together in a face-to-face relationship under heat and/or pressure as described above in order to bond the two.

Finally, while in some embodiments it is preferred that the fill layer 22 does not form strong adhesive bonds with either device surface 14 or carrier surface 34, in other embodiments it may be desirable to formulate fill layer 22 so that it does not form strong adhesive bonds with only one of device surface 14 or carrier surface 34.

Figure 2:
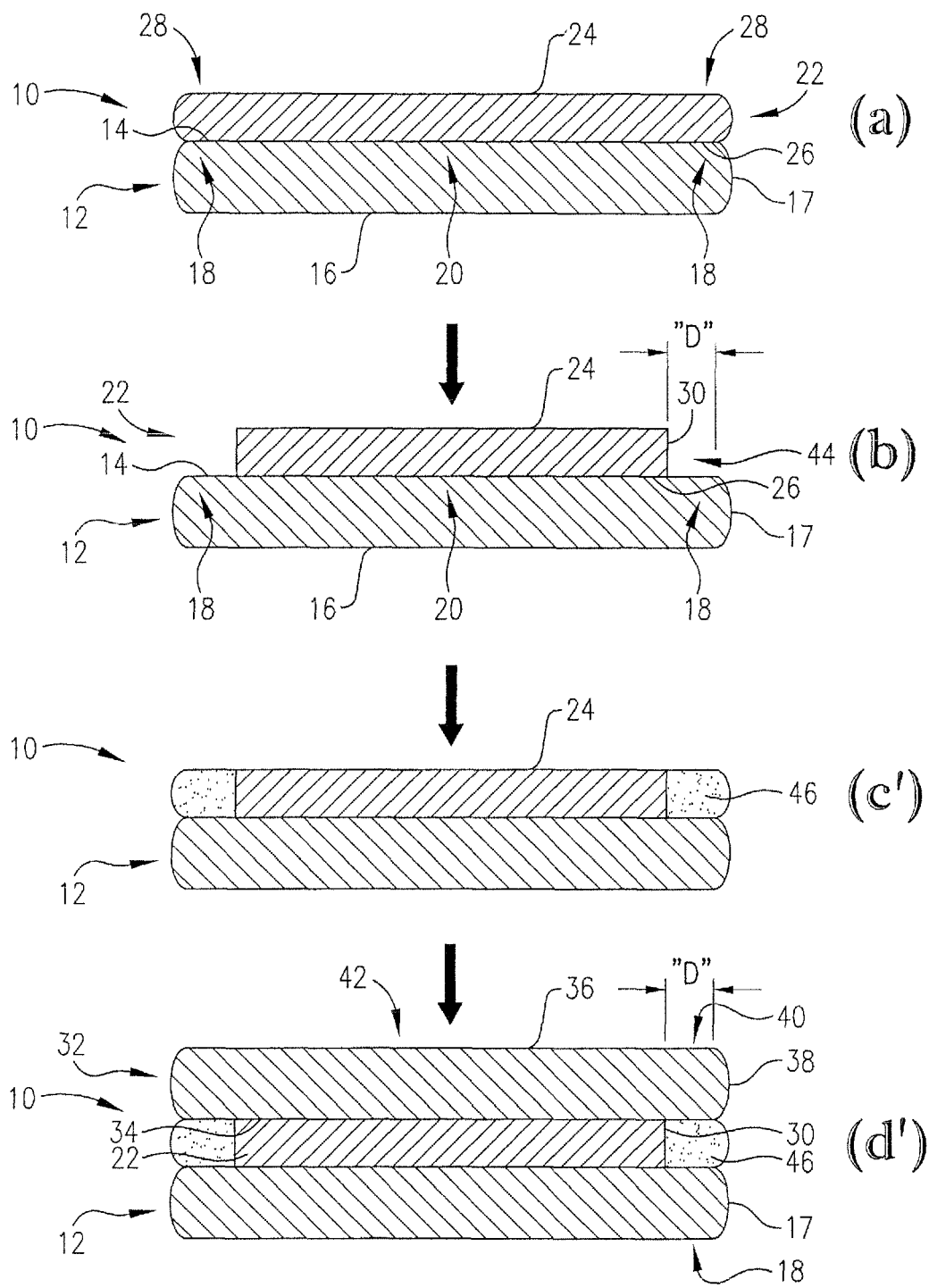
FIG. 2 is a schematic drawing showing an alternative embodiment of the present invention, wherein two of the process steps have been reversed.

Referring to FIG. 2, another alternative embodiment of the present invention is depicted, with like parts being numbered as in FIG. 1. As illustrated in this figure, the substrates 12 and 32, fill layer 22, and edge bond 46 are formed of the same materials as described above with respect to FIG. 1, except that the process order has been altered. That is, referring to step (c') of FIG. 2, the bonding or sealing material used to form edge bond 46 is applied to void 44 after application of fill layer 22 but before contacting of second substrate 32 with fill layer 22 (shown in step (d')).

As was also the case with the embodiment of FIG. 1, first substrate 12 could be the carrier substrate and second substrate 32 could be the device wafer. Again, in this instance, front surface 14 of first substrate 12 will not be a device surface, but rather will be a carrier surface. Also, surface 34 of second substrate 32 will not be a carrier surface, but instead will be a device surface. This alternative arrangement is particularly advantageous because the structure 10 shown in step (c') of FIG. 2 could be fabricated with first substrate 12 being provided as a carrier wafer. This structure could then be provided to an end user who would bond a device wafer to the structure and subject the stack to further processing. Thus, an adhesive-ready carrier would be available to the end user for added convenience, eliminating processing steps for the end user.

Figure 3:
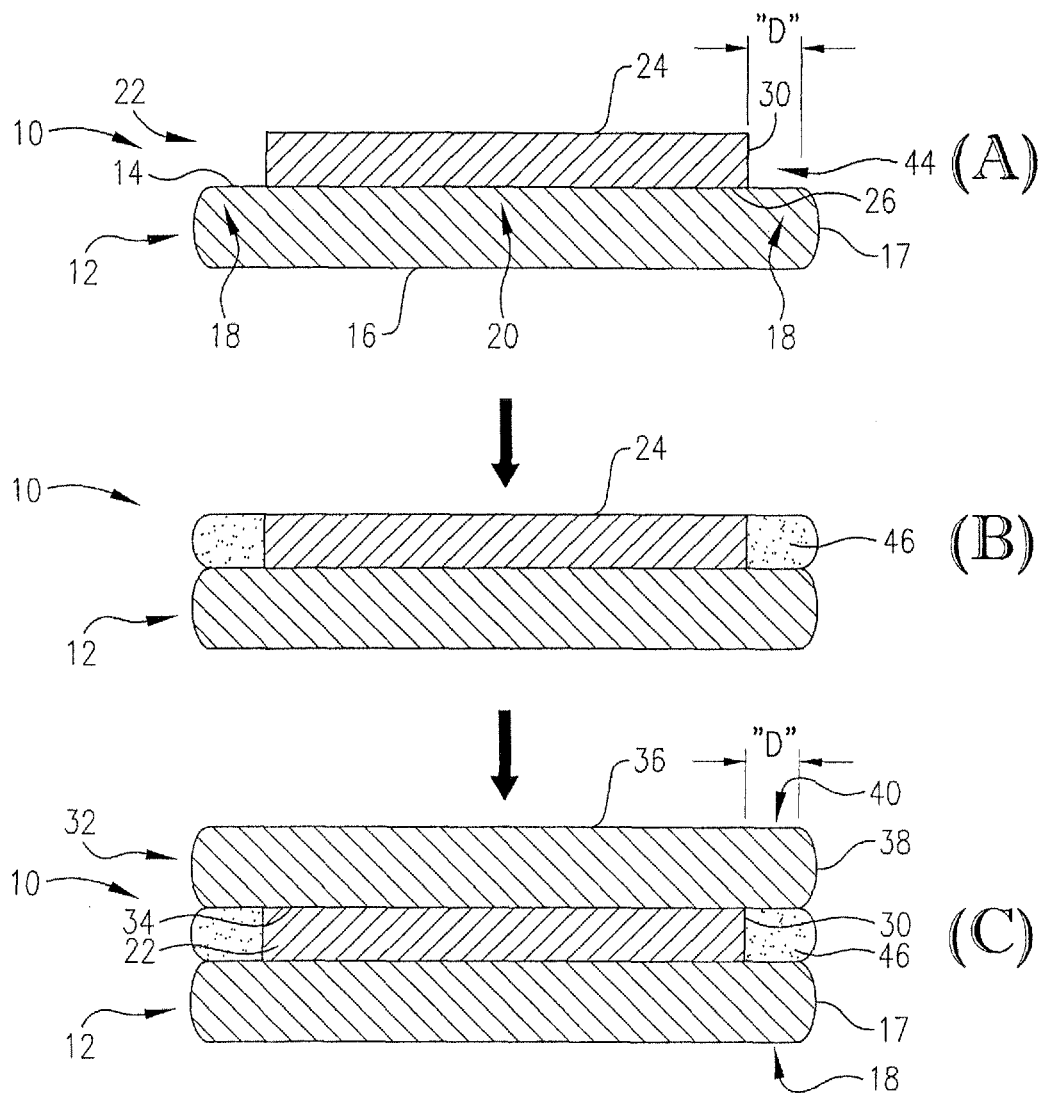
FIG. 3 is a schematic drawing depicting an alternative embodiment of the invention wherein a laminate can be utilized as the fill layer.

FIG. 3 depicts yet a further embodiment of the present invention, again with like numbering being used for like parts. In this embodiment, fill layer 22 is provided as a laminate that is adhered to first substrate 12 under heat, pressure, and/or vacuum as necessary for the particular material to ensure there are no voids between the fill layer 22 and the front surface 14 (see step (A) of FIG. 3). The laminate is pre-cut to the appropriate shape (e.g., circular) or mechanically trimmed after application so that the appropriately sized void 44 will be created, as discussed above. The bonding or sealing material used to form edge bond 46 is applied to void 44 after application of the laminate used to form fill layer 22 and before contacting of second substrate 32 with fill layer 22 (shown in step (C)).

As was also the case with the embodiments of FIGS. 1 and 2, first substrate 12 could be the carrier wafer and second substrate 32 could be the device wafer. Again, in this instance, front surface 14 of first substrate 12 will not be a device surface, but rather will be a carrier surface. Also, surface 34 of second substrate 32 will not be a carrier surface, but instead will be a device surface. As was the case with the embodiment of FIG. 2, this alternative arrangement is particularly advantageous because the structure 10 shown in step (B) of FIG. 3 could be fabricated with first substrate 12 being provided as a carrier substrate. This structure could then be provided to an end user who would bond a device wafer to the structure and subject the stack to further processing.

Figure 4:
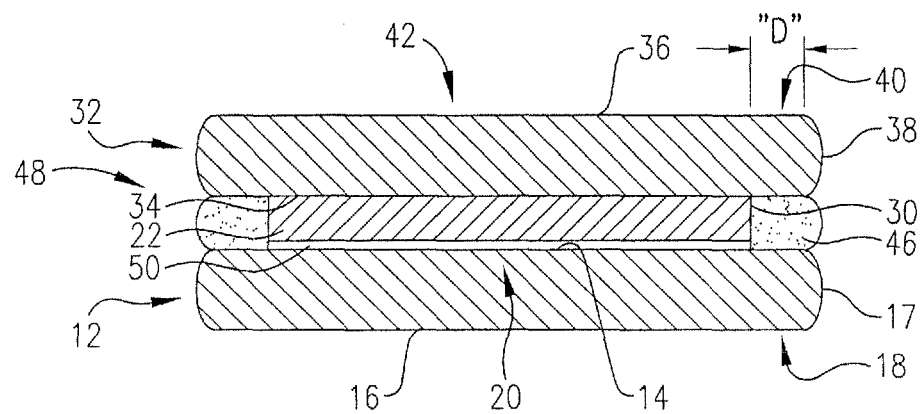
FIG. 4 is a schematic drawing depicting a further alternative embodiment of the invention where a second layer is utilized adjacent the fill layer.

A further alternative embodiment is depicted in FIG. 4, with like numbering being used to depict like parts. A structure 48 is depicted. Structure 48 is similar to structure 10 shown in step (d) of FIG. 1 (and is similarly formed) except that structure 48 further comprises a second layer 50. Layer 50 can be a low adhesive strength layer such as an anti-stick coating (e.g., mold release agent) applied to facilitate separation after backside or other processing. The use of the anti-stick coating lessens the requirement for the fill layer 22 to form a non-stick or low adhesion strength interface with the first or second substrates 12 or 32.

Instead of being in the form of a low adhesive strength layer, layer 50 (not to scale) could also represent an area on the front surface 14 of the first substrate 12 that has been chemically modified to obtain a permanent non-stick surface layer or a surface layer to which a fill material cannot strongly bond. Such modifications may include, for example: (a) chemical treatment of a silicon surface with a hydrophobic organosilane such as a (fluoro)alkyl silane (e.g., perfluoroalkyltrichlorosilane) or a (fluoro)alkyl phosphonate to reduce its surface free energy; or (b) chemical vapor deposition of a low surface free energy coating (e.g., fluorinated parylenes or parylene AF4) onto the carrier to create a permanent non-stick surface. The advantage of this approach is that the filling layer(s) can be selected for any combination of properties (e.g., thickness, solubility, thermal stability) other than providing a non-stick or low adhesive strength interface with the substrate. When a surface modification is carried out, the thickness of layer 50 will generally be on the order of from about 1 nm to about 5 nm.

Finally, instead of being a low adhesive strength layer or a surface modification, layer 50 could also represent a second polymeric layer. Layer 50 could be a polymer coating selected from the group consisting of cyclic olefin polymers and copolymers having low adhesion strength to the substrate 12 or 32 onto which it is applied or to the fill layer 22 in which it is contact, or layer 50 could also be a permanent anti-stick layer such as a fluoropolymer coating (e.g., those sold under the name Teflon® by DuPont). When layer 50 is a low adhesive strength polymer layer, it is preferably applied (e.g., via spin coating) at a thickness of at least about 0.5 µm, and more preferably from about 1 µm to about 10 µm.

The use of a polymer coating as layer 50 allows for customization benefits to the end user. For example, layer 50 could form a non-stick or low adhesive strength interface with first substrate 12 to facilitate easy separation of that substrate once the edge bond 46 has been broken or removed while fill layer 22 is firmly bonded to second substrate 32. The advantage of this configuration is that the fill layer 22 can be very thick (up to several hundred microns) and can be chosen for rapid dissolution in a cleaning solvent but does not have to form a non-stick or low adhesive strength interface with the first substrate 12, or the roles of the layers could be reversed. The application of the layer 50 and fill layer 22 can occur sequentially on first substrate 12 or, alternatively, they can be coated separately, with one of the layers 50 or 22 first placed on each substrate, and then placed into contact with one another.

Regardless of the layer 50 utilized, it should not intermix with, dissolve in, or react with fill layer 22. Furthermore, it should be selected to coat uniformly and without voids or other defects.

Figure 5:
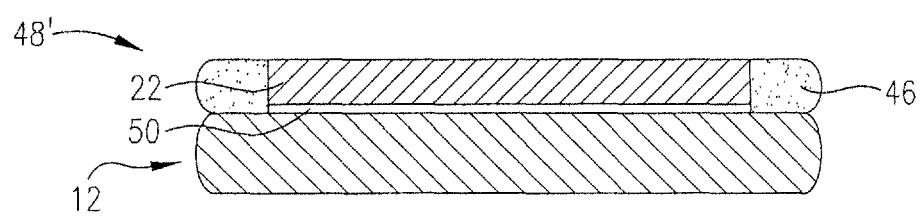
FIG. 5 is a schematic drawing showing a possible commercial variation of the embodiment of FIG. 4.

As was also the case with the embodiments previously discussed, the substrates 12 and 32 could be reversed so that first substrate 12 would be the carrier substrate and second substrate 32 would be the device wafer. Again, in this instance, front surface 14 of first substrate 12 will not be a device surface, but rather will be a carrier surface. Also, surface 34 of second substrate 32 will not be a carrier surface, but instead will be a device surface. This alternative arrangement would again be advantageous because the structure 48' shown in FIG. 5 could be fabricated with first substrate 12 being provided as a carrier wafer. This structure could then be provided to an end user who would bond a device wafer to the structure and subject the stack to further processing. Thus, as with previous embodiments, an adhesive-ready carrier would be available to the end user for added convenience, eliminating processing steps for the end user.

Figure 6:
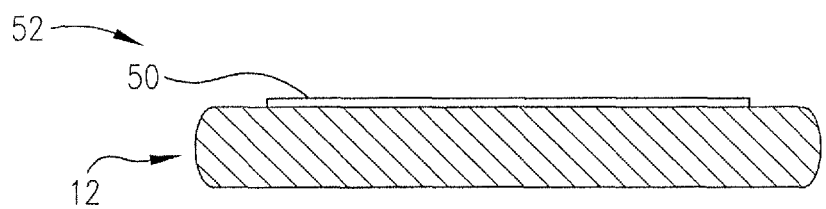
FIG. 6 is a schematic drawing showing a further variation of the present invention.

A further embodiment of the invention is depicted in FIG. 6. In this embodiment, structure 52 is similar to structure 48' shown in FIG. 5, except that structure 52 only comprises substrate 12 and layer 50. In this embodiment, substrate 12 would preferably be a carrier substrate such as those described above. This structure could be provided to an end user who would then use it as a carrier substrate to support a device wafer during processing.

Finally, the materials used to form fill layer 22, edge bond 46, and layer 50 have been described above. It will be appreciated that the mechanism for hardening or curing these materials can be readily selected and adjusted by those of ordinary skill in the art. For example, in some embodiments, it may be desirable to use a non-curing composition for easier dissolving in later removal and cleaning processes. For each of these materials, thermoplastic or rubber-like compositions (typically having a weight average molecular weight of at least about 5,000 Daltons), resin- or rosin-type compositions (typically having a weight average molecular weight of less than about 5,000 Daltons), and mixtures of the foregoing would be suitable.

In other embodiments, a thermosetting material may be better suited, and thus a composition that cures or crosslinks upon heating would be selected. This would require the use of a crosslinking agent and potentially a catalyst in the system as well as a step to induce crosslinking.

In yet another embodiment, a photocurable system may be preferable. This would require the use of a free-radical photoinitiator or photogenerated catalyst in the system as well as a step (e.g., exposure to UV light) to induce curing. This system provides an advantage in some instances in that it can be applied as a 100% solids composition, if necessary.

It will be appreciated that the above can be used to fabricate a number of integrated microdevices, including those selected from the group consisting of silicon-based semiconductor devices, compound semiconductor-based devices, arrays of embedded passive devices (e.g., resistors, capacitors, inductors), MEMS devices, microsensors, photonic circuit devices, light emitting diodes, heat management devices, and planar packaging substrates (e.g., interposers) to which one or more of the foregoing devices has been or will be attached.

EXAMPLES

The following examples set forth preferred methods in accordance with the invention. It is to be understood, however, that these examples are provided by way of illustration and nothing therein should be taken as a limitation upon the overall scope of the invention.

Example 1

Edge Surface Adhesively Bonded and Center Surface Chemically Modified

An epoxy-based photoresist (SU-8 2002, Microchem, Newton, Mass.) was dispensed onto the surface of a 100-mm silicon wafer (wafer 1) at the outer edge to coat a section of the wafer surface that was about 3-5 mm wide. A fluorinated silane ((heptadecafluoro-1,1,2,2-tetrahydradecyl) trichlorosilane) was diluted to a 1% solution using FC-40 solvent (perfluoro compound with primarily $C_{12}$, sold under the name Fluorinert, obtained from 3M). The solution was spin coated onto the surface of wafer 1. The wafer 1 was baked on a hotplate at 100° C. for 1 minute. It was rinsed with FC-40 solvent in a spin coater and baked at 100° C. for an additional 1 minute. The epoxy-based photoresist was removed using acetone in a spin coater, leaving the edge untreated from the fluorinated silane solution.

The surface of another 100-mm silicon wafer (wafer 2) was coated with a bonding composition (WaferBOND® HT10.10, available from Brewer Science Inc., Rolla, Mo.) via spin coating. This wafer was baked at 110° C. for 2 minutes followed by 160° C. for 2 minutes. The coated wafers were bonded in a face-to-face relationship under vacuum at 220° C. for 3 minutes in a heated vacuum and pressure chamber. They were debonded by inserting a razor blade at the edge between the two wafers. After the separation, only a 3-5 mm wide ring of the bonding composition coating transferred to the edge of wafer 1, while the rest of coating remained on wafer 2. Either wafer in this example could be considered the device wafer or the carrier wafer.

Example 2

Edge Surface Adhesively Bonded, Center Surface Chemically Modified, and Debonding Using Solvent Jet at Edge with Wedge An epoxy-based photoresist was dispensed onto the surface of a 200-mm silicon wafer (wafer 1) at the outer edge to coat a section of the wafer surface that was about 3-5 mm wide. A fluorinated silane ((heptadecafluoro-1,1,2,2-tetrahydradecyl) trichlorosilane) was diluted to a 1% solution using FC-40 solvent. The solution was spin coated onto the surface of wafer 1. The wafer 1 was baked on a hotplate at 100° C. for 1 minute. It was rinsed with FC-40 solvent in a spin coater and baked at 100° C. for an additional 1 minute. The epoxy-based photoresist was removed using acetone in a spin coater, leaving the edge untreated from the fluorinated silane solution.

The surface of another 200-mm silicon wafer (wafer 2) was coated with WaferBOND® HT10.10 bonding composition via spin coating. This wafer was baked at 110° C. for 2 minutes and 160° C. for 2 minutes. The coated wafers were bonded in a face-to-face relationship with one another under vacuum at 220° C. for 2 minutes in a heated vacuum and pressure chamber. The wafers were debonded by dispensing dodecene, the solvent in the WaferBOND® HT10.10, directly at the edge of the bonded wafers to dissolve the bonding composition while spinning the wafers to expose the edge of the bonded wafers to the solvent. After the solvent dissolved the material to approximately 0.5-1 mm from the edge, a sharpened round disk was inserted at the edge between the wafers while they were still spinning. This caused the bonding composition to fail at the edge, and the wafers were separated. After the separation, only a 3-5 mm wide ring of the HT10.10 coating transferred to the edge of wafer 1, while the rest of coating remained on wafer 2. Either wafer in this example could be considered the device wafer or the carrier wafer.

Example 3

Edge Surface Adhesively Bonded and Center Surface Coated with Release Material

A negative epoxy-based photoresist (sold under the name SU-8 2010, obtained from MicroChem) was spin coated onto the surface of a 100-mm glass wafer. The wafer was baked at 110° C. for 2 minutes. A Teflon® AF solution (Teflon® AF2400 in FC-40, obtained from DuPont) was spin coated over the SU-8 2010. Then, FC-40 solvent was dispensed onto the surface of the wafer at the outer edge to remove about a 3-5 mm wide section of the Teflon® AF coating from the wafer surface. The wafer was baked at 110° C. for 2 minutes. The wafer was bonded in a face-to-face relationship with a blank, 100-mm silicon wafer under vacuum at 120° C. for 3 minutes in a heated vacuum & pressure chamber. The bonded wafers were exposed to broadband UV light from the outer side of the glass wafer. The exposed wafers were baked at 120° C. for 2 minutes to crosslink the SU-8 2010 coating. They were debonded by inserting a razor blade at the edge between the two wafers. After separation, the silicon wafer had only a ring of material at the outer 3-5 mm, while there was no material transfer in the center. Either wafer in this example could be considered the device wafer or the carrier wafer.

Example 4

Edge Surface Adhesively Bonded and Center Surface of Coated with Adhesion Promoter A silicone acrylate copolymer was prepared by first mixing the following to prepare a monomer solution: 624 g of methacryloxypropyl tris(tris-methylsiloxy)silane; 336 g of glycidyl methacrylate; and 9.6 g of dicumyl peroxide. Next, 1430.4 g of 1-butanol was added to a reactor and heated to 116° C. in one hour. The monomer solution was drop-added over 4 hours, and polymerization was carried out for 20 hours at 116° C. to yield a silicone acrylate copolymer solution having a percent solids of 40.4%.

The copolymer solution was spin coated onto the surface of a 100-mm silicon wafer (wafer 1). Then 1-butanol was dispensed onto the surface of the wafer at the outer edge to remove about a 3-5 mm wide section of the silicone acrylate copolymer coating from the wafer surface. The wafer was baked on a hotplate at 110° C. for 2 minutes. The surface of another 100-mm silicon wafer (wafer 2) was coated with Brewer Science's WaferBOND® HT10.10 wafer bonding composition via spin coating. This wafer was then baked at 110° C. for 2 minutes and 160° C. for 2 minutes. The coated wafers were bonded in a face-to-face relationship with one another under vacuum at 220° C. for 3 minutes in a heated vacuum and pressure chamber. They were debonded by inserting a razor blade at the edge between the two wafers. After the separation, only a 3-5 mm wide ring of the HT10.10 coating remained on the edge of wafer 2, while the rest of coating was cleanly transferred to wafer 1. Either wafer in this example could be considered the device wafer or the carrier wafer.

Example 5

Edge Surface Adhesively Bonded and Center Surface Filled with Material Having Low Adhesion to Either Substrate The Teflon® AF solution used in Example 3 was spin coated onto the surface of a 100-mm silicon wafer (wafer 1). Next, FC-40 solvent was dispensed onto the surface of the wafer at the outer edge to remove about a 3-5 mm wide section of the Teflon® AF coating from the wafer surface. The wafer was baked at 110° C. for 2 minutes. The edge of the wafer was coated with WaferBOND® HT10.10 bonding composition via spin coating, with the material only being dispensed at the edge. The wafer was bonded in a face-to-face relationship with a blank, 100-mm silicon wafer (wafer 2) under vacuum at 220° C. for 2 minutes in a heated vacuum and pressure chamber. The wafers were debonded by inserting a razor blade at the edge between the two wafers. After separation, wafer 2 had only a ring of the bonding material on the outer 3-5 mm, while there was no material transfer in the center. Either wafer in this example could be considered the device wafer or the carrier wafer.

We claim:

1. An article comprising:
a first substrate having front and back surfaces, said front surface having a peripheral region and a central region, wherein said first substrate comprises a device wafer having a device surface comprising an array of devices selected from the group consisting of integrated circuits; MEMS; microsensors; power semiconductors; light-emitting diodes; photonic circuits; interposers; embedded passive devices; and microdevices fabricated on or from a material selected from the group consisting of silicon, silicon-germanium, gallium arsenide, and gallium nitride;
an edge bond presenting first and second surfaces, said first surface being bonded to said peripheral region and said second surface being remote from said peripheral region, said edge bond being absent from said central region so as to form a fill zone, said edge bond being formed from a material comprising monomers, oligomers, or polymers selected from the group consisting of epoxies, acrylics, silicones, styrenics, vinyl halides, vinyl esters, polyamides, polyimides, polysulfones, polyethersulfones, cyclic olefins, polyolefin rubbers, and polyurethanes, wherein the integrity of said edge bond is maintained upon being submerged in concentrated sulfuric acid at room temperature for 10 minutes or in 30% by weight potassium hydroxide solution at about 85° C. for about 45 minutes; and
an amorphous polymeric fill material in said fill zone, said material having an adhesion strength of less than about 50 psig and being absent from said first and second surfaces, wherein the adhesion strength is determined by ASTM D4541/D7234, wherein said edge bond has an adhesion strength that is at least about 0.5 psig greater than said fill material adhesion strength.

2. The article of claim 1, wherein said first substrate comprises a material selected from the group consisting of silicon, sapphire, quartz, metal, glass, and ceramics.

3. The article of claim 1, further comprising a second substrate having a carrier surface, said edge bond being further bonded to said carrier surface.

4. The article of claim 3, wherein said second substrate comprises a material selected from the group consisting of silicon, sapphire, quartz, metal, glass, and ceramics.

5. The article of claim 3, wherein said fill material presents a first surface and a second surface, said article further comprising a layer in contact with one of said first and second surfaces, and wherein said layer is selected from the group consisting of a low adhesive strength layer, a polymeric layer, and a surface modification of said carrier surface or of said surface.

6. The article of claim 5, wherein said layer is in contact with said carrier surface.

7. The article of claim 1, said device surface comprising at least one structure selected from the group consisting of: solder bumps; metal posts; metal pillars; and structures formed from a material selected from the group consisting of silicon, polysilicon, silicon dioxide, silicon (oxy)nitride, metal, low k dielectrics, polymer dielectrics, metal nitrides, and metal silicides.

8. The article of claim 1, wherein said fill material presents a first surface and a second surface, said article further comprising a layer in contact with one of said first and second surfaces.

9. The article of claim 1, wherein said edge bond has a width of from about 2 mm to about 15 mm.

10. The article of claim 1, wherein said fill material comprises monomers, oligomers, and/or polymers selected from the group consisting of cyclic olefins and amorphous fluoropolymers.

11. The article of claim 1, wherein said edge bond remains stable at temperatures up to about 350° C.

12. An article comprising:
a first substrate having front and back surfaces, said front surface having a peripheral region and a central region, wherein said first substrate comprises a material selected from the group consisting of silicon, sapphire, quartz, metal, glass, and ceramics, and said front surface comprises an array of devices;
an edge bond presenting first and second surfaces, said first surface being bonded to said peripheral region and said second surface being remote from said peripheral region, said edge bond being absent from said central region so as to form a fill zone, wherein the integrity of said edge bond is maintained upon being submerged in concentrated sulfuric acid at room temperature for 10 minutes or in 30% by weight potassium hydroxide solution at about 85° C. for about 45 minutes, wherein said edge bond is formed from a material comprising monomers, oligomers, or polymers selected from the group consisting of epoxies, acrylics, silicones, styrenics, vinyl halides, vinyl esters, polyamides, polyimides, polysulfones, polyethersulfones, cyclic olefins, polyolefin rubbers, and polyurethanes; and
an amorphous polymeric fill material in said fill zone, said fill material having an adhesion strength of less than about 50 psig and being absent from said first and second surfaces, wherein the adhesion strength is determined by ASTM D4541/D7234, wherein said edge bond has an adhesion strength that is at least about 0.5 psig greater than said fill material adhesion strength.

13. The article of claim 12, further comprising a second substrate having a carrier surface, said edge bond being further bonded to said carrier surface.

14. The article of claim 13, wherein said second substrate comprises a material selected from the group consisting of silicon, sapphire, quartz, metal, glass, and ceramics.

15. The article of claim 12, said devices comprising at least one structure selected from the group consisting of: solder bumps; metal posts; metal pillars; and structures formed from a material selected from the group consisting of silicon, polysilicon, silicon dioxide, silicon (oxy)nitride, metal, low k dielectrics, polymer dielectrics, metal nitrides, and metal silicides.

16. The article of claim 12, wherein said fill material presents a first surface and a second surface, said article further comprising a layer in contact with one of said first and second surfaces of said fill material.

17. The article of claim 16, further comprising a second substrate having a carrier surface, and wherein said layer is selected from the group consisting of a low adhesive strength layer, a polymeric layer, and a surface modification of said carrier surface or of said front surface.

18. The article of claim 17, wherein said second layer is in contact with said carrier surface.

19. The article of claim 12, wherein said edge bond has a width of from about 2 mm to about 15 mm.

20. The article of claim 12, wherein said fill material comprises monomers, oligomers, and/or polymers selected from the group consisting of cyclic olefins and amorphous fluoropolymers.

21. An article comprising:
   a first substrate having front and back surfaces, said front surface having a peripheral region and a central region;
   an edge bond bonded to said peripheral region, said edge bond being absent from at least some of said central region so as to form a fill zone, said edge bond being formed from a material comprising monomers, oligomers, or polymers selected from the group consisting of epoxies, acrylics, silicones, styrenics, vinyl halides, vinyl esters, polyamides, polyimides, polysulfones, polyethersulfones, cyclic olefins, polyolefin rubbers, and polyurethanes, wherein the integrity of said edge bond is maintained upon being submerged in concentrated sulfuric acid at room temperature for 10 minutes or in 30% by weight potassium hydroxide solution at about 85° C. for about 45 minutes;
   an amorphous polymeric fill material in said fill zone, said material having an adhesion strength of less than about 50 psig, wherein the adhesion strength is determined by ASTM D4541/D7234, wherein said edge bond has an adhesion strength that is at least about 0.5 psig greater than said fill material adhesion strength; and
   a second substrate having a carrier surface, said edge bond being further bonded to said carrier surface.

22. The article of claim 21, wherein said second substrate comprises a material selected from the group consisting of silicon, sapphire, quartz, metal, glass, and ceramics.

23. The article of claim 21, wherein said first substrate comprises a device wafer having a device surface, said device surface comprising at least one structure selected from the group consisting of: solder bumps; metal posts; metal pillars; and structures formed from a material selected from the group consisting of silicon, polysilicon, silicon dioxide, silicon (oxy)nitride, metal, low k dielectrics, polymer dielectrics, metal nitrides, and metal silicides.

24. The article of claim 21, wherein said fill material presents a first surface and a second surface, said article further comprising a layer in contact with one of said first and second surfaces.

25. The article of claim 24, wherein said layer is selected from the group consisting of a low adhesive strength layer, a polymeric layer, and a surface modification of said carrier surface or of said front surface.

26. The article of claim 25, wherein said layer is in contact with said carrier surface.

27. The article of claim 21, wherein said edge bond has a width of from about 2 mm to about 15 mm.

28. The article of claim 21, wherein said fill material comprises monomers, oligomers, and/or polymers selected from the group consisting of cyclic olefins and amorphous fluoropolymers.

* * * * *